(12) United States Patent
Liang et al.

(10) Patent No.: US 12,477,871 B2
(45) Date of Patent: Nov. 18, 2025

(54) COLOR CONVERSION PANEL AND DISPLAY DEVICE

(71) Applicant: Industrial Technology Research Institute, Hsinchu (TW)

(72) Inventors: Kai-Ling Liang, Hsinchu (TW); Wei-Hung Kuo, Hsinchu (TW); Hui-Tang Shen, Taoyuan (TW); Chun-I Wu, Tainan (TW); Suh-Fang Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 524 days.

(21) Appl. No.: 18/082,540

(22) Filed: Dec. 15, 2022

(65) Prior Publication Data

US 2024/0145641 A1 May 2, 2024

(30) Foreign Application Priority Data

Oct. 28, 2022 (TW) .................... 111141246

(51) Int. Cl.
*H10H 20/851* (2025.01)
*H10F 39/00* (2025.01)
(Continued)

(52) U.S. Cl.
CPC ..... *H10H 20/8513* (2025.01); *H10F 39/8063* (2025.01); *H10H 20/835* (2025.01); *H10H 20/841* (2025.01)

(58) Field of Classification Search
CPC ............. H10H 20/8513; H10H 20/835; H10H 20/841; H10H 20/8514; H10F 39/8063; H01L 25/0753
See application file for complete search history.

(56) References Cited

U.S. PATENT DOCUMENTS 8,508,830 B1 8/2013 Wang
8,866,374 B2 10/2014 Moon
(Continued)

FOREIGN PATENT DOCUMENTS

CN 106501995 3/2017
CN 110211986 9/2019
(Continued)

OTHER PUBLICATIONS

"Office Action of Taiwan Counterpart Application", issued on Dec. 12, 2023, p. 1-p. 5.
(Continued)

*Primary Examiner* — Kevin Quarterman
(74) *Attorney, Agent, or Firm* — JCIPRNET (57) ABSTRACT

A color conversion panel and a display device are provided. The color conversion panel includes an opaque substrate and a sapphire substrate. The opaque substrate includes a plurality of first pixel openings, a plurality of second pixel openings and a plurality of third pixel openings. The first pixel openings are filled with red quantum dot material, and the second pixel openings are filled with green quantum dot material. The sapphire substrate is on the opaque substrate. A first surface of the sapphire substrate that faces the opaque substrate has a plurality of first arc surfaces corresponding to the first pixel openings, a plurality of second arc surfaces corresponding to the second pixel openings, and a plurality of third arc surfaces corresponding to the third pixel openings.

20 Claims, 8 Drawing Sheets (51) Int. Cl.
  *H10H 20/832* (2025.01)
  *H10H 20/841* (2025.01)

(56) References Cited

U.S. PATENT DOCUMENTS

| | | | |
|---|---|---|---|
| 2019/0252579 A1 | 8/2019 | Choi et al. |
| 2020/0343410 A1 | 10/2020 | Iguchi |
| 2021/0005583 A1 | 1/2021 | Iguchi et al. |
| 2021/0407977 A1 | 12/2021 | Tian et al. |
| 2022/0158038 A1 | 5/2022 | Jeon et al. |
| 2022/0165924 A1 | 5/2022 | Lim et al. |

FOREIGN PATENT DOCUMENTS

| | | |
|---|---|---|
| CN | 111490061 | 8/2020 |
| CN | 111769109 | 10/2020 |
| CN | 112054040 | 12/2020 |
| CN | 113178513 | 7/2021 |
| CN | 111710770 | 12/2021 |
| CN | 113782561 | 12/2021 |
| CN | 216053106 | 3/2022 |
| JP | H0627317 | 2/1994 |
| JP | 2004063819 | 2/2004 |
| JP | 2006165041 | 6/2006 |
| JP | 2017175004 | 9/2017 |
| JP | 2019009408 | 1/2019 |
| JP | 2019179111 | 10/2019 |
| JP | 2020205417 | 12/2020 |
| JP | 2021503626 | 2/2021 |
| JP | 2021140028 | 9/2021 |
| JP | 2022118915 | 8/2022 |
| TW | 201027808 | 7/2010 |
| TW | 201123549 | 7/2011 |
| TW | I612693 | 1/2018 |
| TW | 202114262 | 4/2021 |
| TW | I726849 | 5/2021 |
| TW | 202122833 | 6/2021 |
| TW | 202125807 | 7/2021 |
| TW | 202132871 | 9/2021 |
| WO | 2021249149 | 12/2021 |

OTHER PUBLICATIONS

"Office Action of Japan Counterpart Application", issued on Oct. 18, 2023, p. 1-p. 5.

"Office Action of Japan Counterpart Application", issued on Mar. 18, 2024, p. 1-p. 4.

Junho Bae et al., "Quantum dot-integrated GaN light-emitting diodes with resolution beyond the retinal limit", Nature Communications, vol. 13, Apr. 6, 2022, pp. 1-9.

COLOR CONVERSION PANEL AND DISPLAY DEVICE

CROSS-REFERENCE TO RELATED APPLICATION

This application claims the priority benefit of Taiwanese application no. 111141246, filed on Oct. 28, 2022. The entirety of the above-mentioned patent application is hereby incorporated by reference herein and made a part of this specification.

TECHNICAL FIELD

The present disclosure relates to a panel and a display, and more particularly to a color conversion panel and a display device.

BACKGROUND

In recent years, as the display technology has been more fully developed, light-emitting elements with low energy consumption that can provide high-contrast images are also adopted in display devices. However, as the pitch between pixels becomes smaller and smaller, the cross-talk phenomenon between adjacent pixels become more serious and thus the performance of color purity and color gamut are affected. When a monochromatic light-emitting diode is combined with a quantum dot material for color conversion to achieve color display, the quantum dot material with isotropic light-emitting characteristic also makes the cross-talk problem even worse.

SUMMARY

A color conversion panel of the disclosure includes an opaque substrate and a sapphire substrate. The opaque substrate includes a plurality of first pixel openings, a plurality of second pixel openings and a plurality of third pixel openings. The first pixel openings are filled with red quantum dot material, and the second pixel openings are filled with green quantum dot material. The sapphire substrate is on the opaque substrate. A first surface of the sapphire substrate that faces the opaque substrate has a plurality of first arc surfaces corresponding to the first pixel openings, a plurality of second arc surfaces corresponding to the second pixel openings, and a plurality of third arc surfaces corresponding to the third pixel openings.

The display device of the disclosure includes a light-emitting pixel array panel and a color conversion panel. The light-emitting pixel array panel has a plurality of light-emitting elements. The color conversion panel is configured on the light-emitting pixel array panel. The color conversion panel includes an opaque substrate and a sapphire substrate. The opaque substrate includes a plurality of first pixel openings, a plurality of second pixel openings and a plurality of third pixel openings. The first pixel openings are filled with red quantum dot material, and the second pixel openings are filled with green quantum dot material. The sapphire substrate is on the opaque substrate. A first surface of the sapphire substrate that faces the opaque substrate has a plurality of first arc surfaces corresponding to the first pixel openings, a plurality of second arc surfaces corresponding to the second pixel openings, and a plurality of third arc surfaces corresponding to the third pixel openings.

DETAILED DESCRIPTION OF DISCLOSED EMBODIMENTS

Figure 1A:
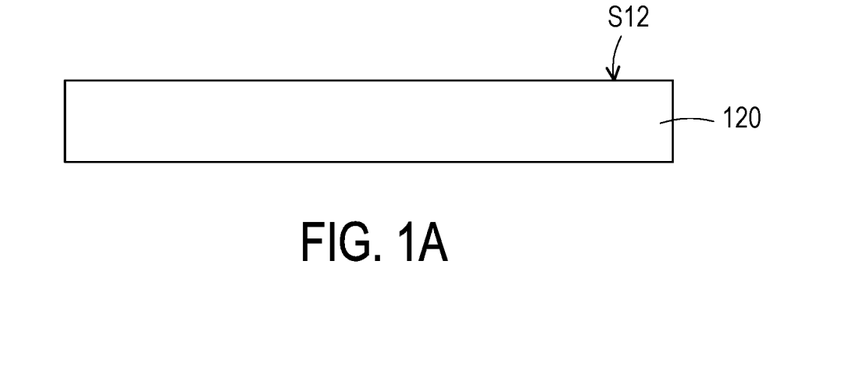
FIG. 1A to FIG. 1F are cross-sectional schematic diagrams illustrating the manufacturing process of a color conversion panel and a display device according to an embodiment of the present disclosure.
Figure 1B:
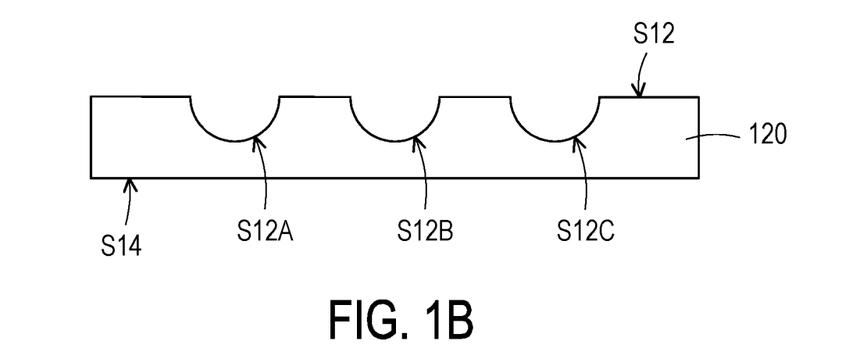

FIG. 1A to FIG. 1F are cross-sectional schematic diagrams illustrating the manufacturing process of a color conversion panel and a display device according to an embodiment of the present disclosure. Referring to FIG. 1A, in the manufacturing process of the color conversion panel and the display device of the present embodiment, a sapphire substrate 120 is provided first. Next, please refer to FIG. 1B, an etching process or other appropriate methods is performed to form a plurality of first arc surfaces S12A, a plurality of second arc surfaces S12B and a plurality of third arc surfaces S12C on the first surface S12 of the sapphire substrate 120. For ease of illustration, only one arc surface is shown here.

Figure 1C:
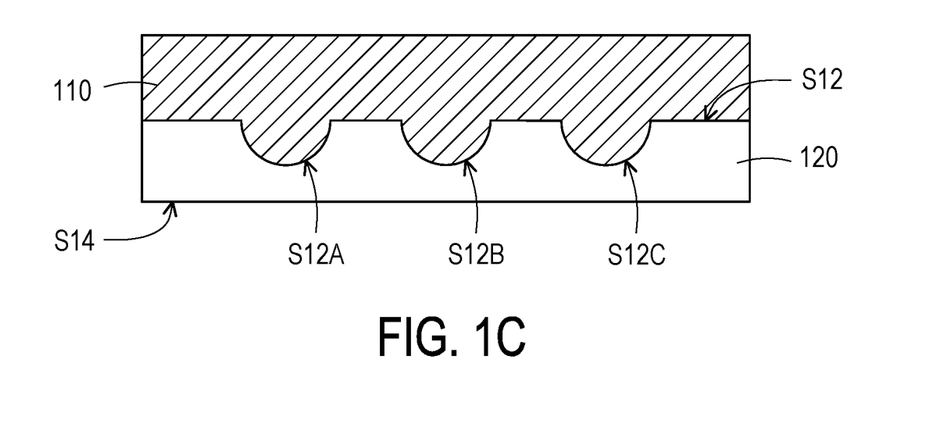

Then please refer to FIG. 1C, for example, an opaque substrate 110 is formed on the first surface S12 of the sapphire substrate 120 by an epitaxy process or other appropriate methods. The material of the opaque substrate 110 may be polysilicon, metal or other opaque materials. Opaque refers to the characteristic of having low transmittance to visible light. In this embodiment, the inner concave surface of the first arc surface S12A, the inner concave surface of the second arc surface S12B, and the inner concave surface of the third arc surface S12C face the opaque substrate 110.

Figure 1D:
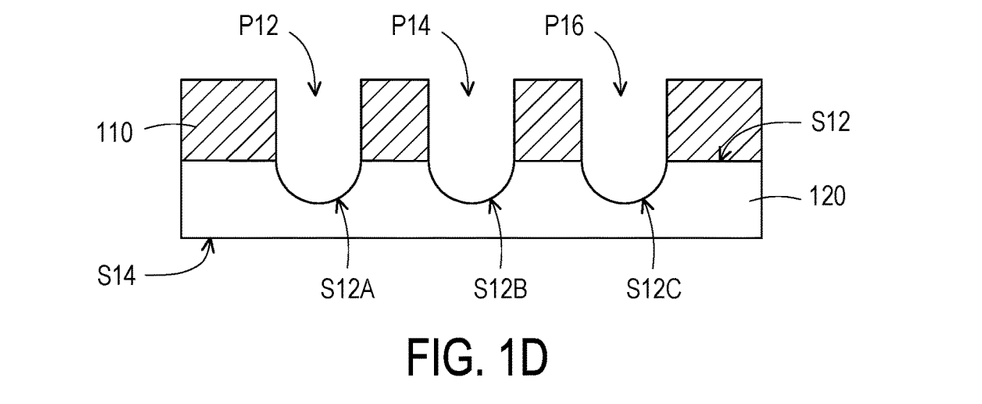

Referring to FIG. 1D, for example, a plurality of first pixel openings P12, a plurality of second pixel openings P14, and a plurality of third pixel openings P16 are formed on the opaque substrate 110 through an ion reactive etching process or other appropriate methods. For ease of illustration, only one pixel opening is shown here. The position of each first pixel opening P12 corresponds to a first arc surface S12A, the position of each second pixel opening P14 corresponds to a second arc surface S12B, and the position of each third pixel opening P16 corresponds to a third arc surface S12C.

Figure 1E:
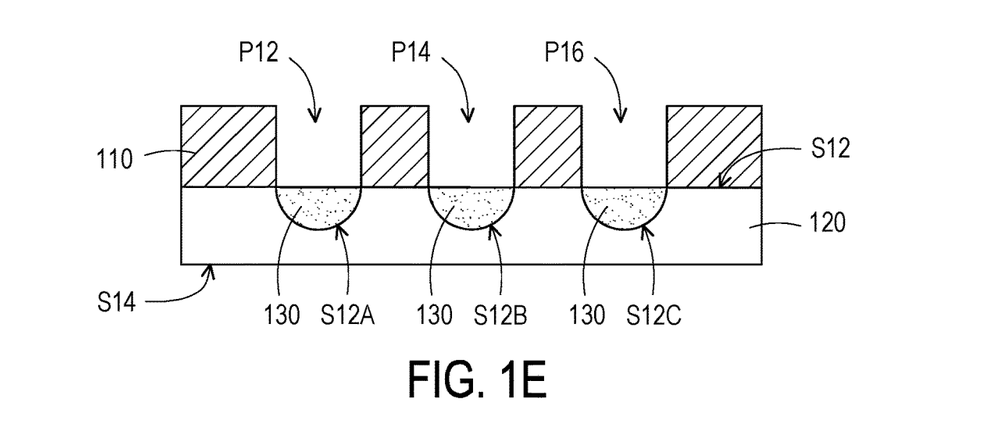

Next, referring to FIG. 1E, optionally, a plurality of high-refractive material layers 130 are formed in a space defined by the first arc surface S12A, the second arc surface S12B, and the third arc surface S12C. The high-refractive material layer 130 is located between the first arc surface S12A and the first pixel opening P12, between the second arc surface S12B and the second pixel opening P14, and between the third arc surface S12C and the third pixel opening P16.

Figure 1F:
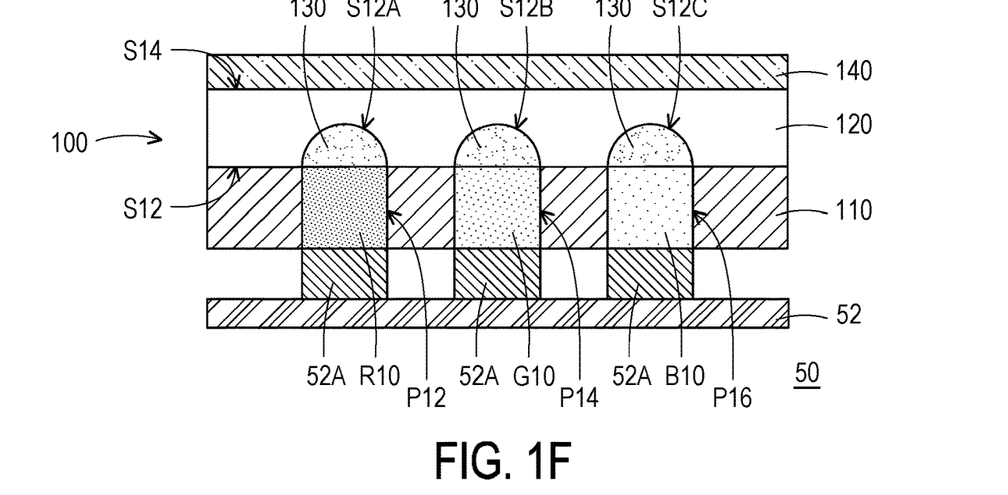

Next, referring to FIG. 1F, the red quantum dot material R10 is filled in the first pixel opening P12, and the green quantum dot material G10 is filled in the second pixel opening P14. In addition, the blue quantum dot material B10 may also be selectively filled into the third pixel opening P16. In other embodiments, the third pixel opening P16 may not be filled with a solid material, or may be filled with a polymer material or other appropriate material with better light transmission. In other embodiments, a reflecting layer (not shown) may be disposed on the inner walls of the first pixel opening P12, the second pixel opening P14, and the third pixel opening P16 of the opaque substrate 110, and the material of the reflecting layer is metal or other highly reflective materials. In this way, the color conversion panel 100 of this embodiment is basically completed. Moreover, a distributed Bragg reflecting layer 140 may also be selectively disposed on a second surface S14 of the sapphire substrate 120 away from the opaque substrate 110.

Then, the color conversion panel 100 is combined with a light-emitting pixel array panel 52, and the display device 50 of this embodiment is basically completed.

The display device 50 of this embodiment includes a light-emitting pixel array panel 52 and a color conversion panel 100. The light-emitting pixel array panel 52 has a plurality of light-emitting elements 52A. The light-emitting element may be an inorganic light-emitting diode chip or an organic light-emitting diode chip. The size of the light-emitting element is on the level of microns. The size of the light-emitting element may be on the level below 100 microns. The side length of the light-emitting element may be less than 100 microns. The light-emitting element may be a micro light-emitting diode (micro LED). The color conversion panel 100 is disposed on the light-emitting pixel array panel 52. The color conversion panel 100 includes an opaque substrate 110 and a sapphire substrate 120. The opaque substrate 110 includes a plurality of first pixel openings P12, a plurality of second pixel openings P14, and a plurality of third pixel openings P16. The first pixel opening P12 is filled with red quantum dot material R10, and the second pixel opening P14 is filled with green quantum dot material G10. The sapphire substrate 120 is located on the opaque substrate 110. The first surface S12 of the sapphire substrate 120 that faces the opaque substrate 110 has a plurality of first arc surfaces S12A corresponding to the first pixel opening P12, a plurality of second arc surfaces S12B corresponding to the second pixel opening P14, and a plurality of third arc surfaces S12C corresponding to the third pixel opening P16.

In the display device 50 and the color conversion panel 100 of this embodiment, the light emitted by the light-emitting element 52A is, for example, incident on the red quantum dot material R10 in the first pixel opening P12. Then, the red quantum dot material R10 converts the light into red light and emits the red light. When the red light passes through the first arc surface S12A, the light will be refracted to produce a light-converging effect, thereby reducing the amount of red light incident on adjacent sub-pixels, that is, reducing cross-talk phenomenon. Similarly, the light emitted by the light-emitting element 52A is, for example, incident on the green quantum dot material G10 in the second pixel opening P14. When the green light emitted by the green quantum dot material G10 passes through the second arc surface S12B, the light is also refracted to produce a light-converging effect, thereby reducing the amount of green light incident on adjacent sub-pixels. The light emitted by the light-emitting element 52A is, for example, incident on the blue quantum dot material B10 in the third pixel opening P16. When the blue light emitted by the blue quantum dot material B10 passes through the third arc surface S12C, the light will also be refracted to produce a light-converging effect, thereby reducing the amount of blue light incident on adjacent sub-pixels.

Since the first pixel opening P12, the second pixel opening P14, and the third pixel opening P16 formed on the opaque substrate 110 are adopted, it is possible to prevent different color lights from generating cross-talk between the first pixel opening P12, the second pixel opening P14, and the third pixel opening P16. Furthermore, the first arc surface S12A, the second arc surface S12B, and the third arc surface S12C also have the effect of converging light, thereby reducing the possibility for the color lights exiting the first arc surface S12A, the second arc surface S12B, and the third arc surface S12C to generate cross-talk. Moreover, since the processing of the sapphire substrate 120 is relatively easy, the process time and cost of the display device 50 and the color conversion panel 100 of this embodiment are also reduced.

The refractive index of the high-refractive material layer 130 is, for example, between 1.7 and 2.0. In this embodiment, the refractive index of the high-refractive material layer 130 is, for example, between the refractive index of the quantum dot material and the refractive index of the sapphire substrate 120. The high-refractive material layer 130 is helpful to enhance the effect of converging light produced by the first arc surface S12A, the second arc surface S12B, and the third arc surface S12C.

The distributed Bragg reflecting layer 140 is able to prevent ambient light from entering the display device 50 and excite the quantum dot material to emit light that does not meet the requirements, and the distributed Bragg reflecting layer 140 is also able to prevent light not in the desired wavelength band from emitting from the display device 50.

The light-emitting element 52A in this embodiment is exemplified as emitting blue light, but the present disclosure is not limited thereto. When the light-emitting element 52A emits blue light, even if the third pixel opening P16 is not filled with the blue quantum dot material B10 but is kept in vacuum or only filled with gas, or filled with a polymer material with better light transmission or other appropriate materials, etc., the light exiting the third pixel opening P16 is still blue light. Therefore, the purpose of color display may still be achieved. In other embodiments, the light-emitting element 52A emits ultraviolet light, and the third pixel opening P16 is required to be filled with blue quantum dot material B10 to convert the ultraviolet light into visible light in the blue wavelength band.

FIG. 2A to FIG. 2F are cross-sectional schematic diagrams illustrating the manufacturing process of a color conversion panel and a display device according to another embodiment of the present disclosure. Please refer to FIG. 2F, a display device 60 and a color conversion panel 200 of this embodiment are similar to the display device 50 and the color conversion panel 100 of FIG. 1F, and the following description mainly focuses on the difference between the two embodiments. In addition, various additional technical solutions in the embodiment of FIG. 1F that do not cause conflict when applied to this embodiment may also be applied to this embodiment.

Figure 2A:
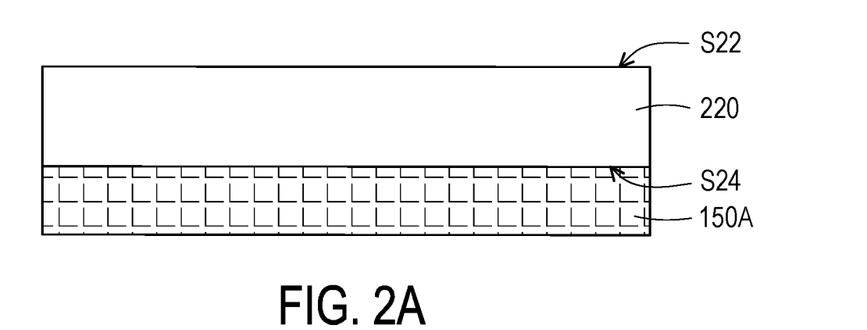
FIG. 2A to FIG. 2F are cross-sectional schematic diagrams illustrating the manufacturing process of a color conversion panel and a display device according to another embodiment of the present disclosure.
Figure 2B:
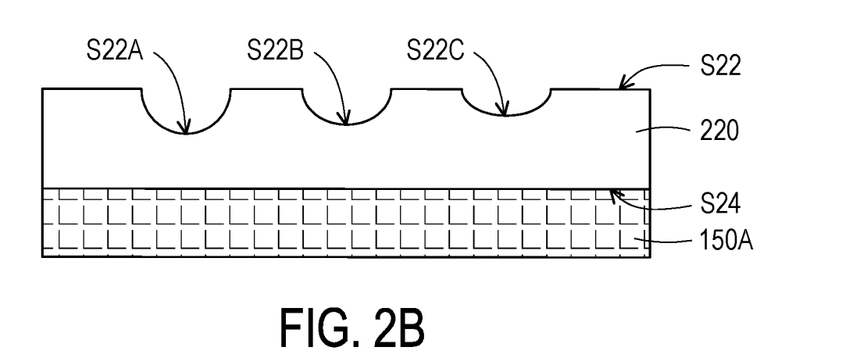
Figure 2C:
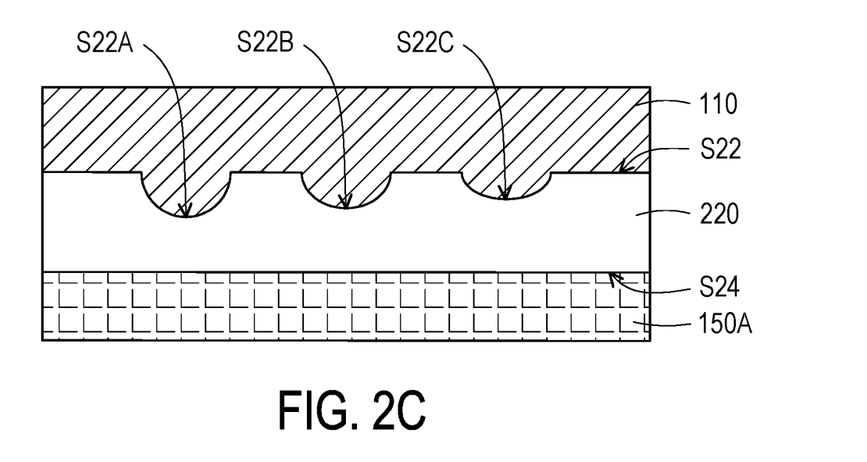

Referring to FIG. 2A, in the manufacturing process of the color conversion panel and the display device of the present embodiment, firstly, a sapphire substrate 220 and a gallium nitride layer 150A that are combined together are provided. Next, please refer to FIG. 2B, an etching process or other appropriate methods is performed to form a plurality of first arc surfaces S22A, a plurality of second arc surfaces S22B, and a plurality of third arc surfaces S22C on the first surface S22 of the sapphire substrate 220. For ease of illustration, only one arc surface is shown here. Then please refer to FIG. 2C, for example, an opaque substrate 110 is formed on the first surface S22 of the sapphire substrate 220 through an epitaxy process or other suitable methods. The material of the opaque substrate 110 may be polysilicon, metal or other opaque materials.

Figure 2D:
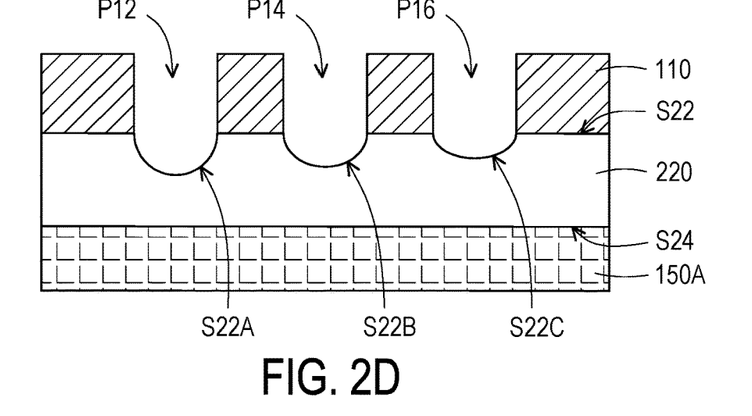

Then please refer to FIG. 2D, for example, a plurality of first pixel openings P12, a plurality of second pixel openings P14, and a plurality of third pixel openings P16 are formed on the opaque substrate 110 through an ion reactive etching process or other appropriate methods. For ease of illustration, only one pixel opening is shown here. The position of each first pixel opening P12 corresponds to a first arc surface S22A, the position of each second pixel opening P14 corresponds to a second arc surface S22B, and the position of each third pixel opening P16 corresponds to a third arc surface S22C.

Figure 2E:
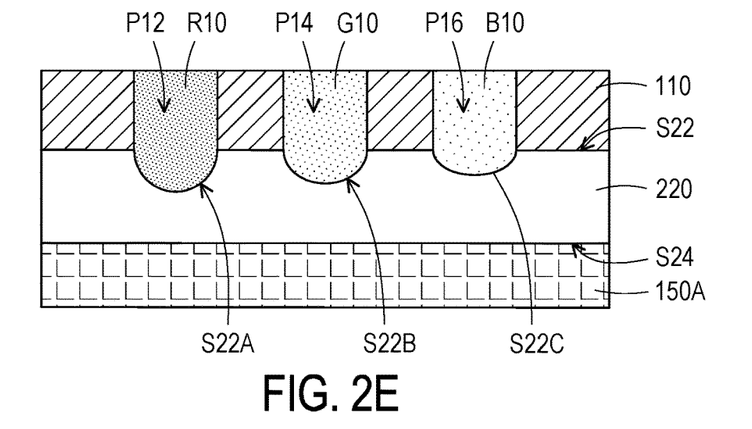

Next, referring to FIG. 2E, optionally, red quantum dot material R10 is filled in a space defined by the first pixel opening P12 and the first arc surface S22A, and green quantum dot material G10 is filled in a space defined by the second pixel opening P14 and the second arc surface S22B. Moreover, the blue quantum dot material B10 may also be selectively filled in a space defined by the third pixel opening P16 and the third arc surface S22C. In other embodiments, the space defined by the third pixel opening P16 and the third arc surface S22C may not be filled with a solid material, or may be filled with a polymer material or other appropriate materials with better light transmittance. In this way, the color conversion panel 200 of this embodiment is basically completed, which is shown in FIG. 2F.

Figure 2F:
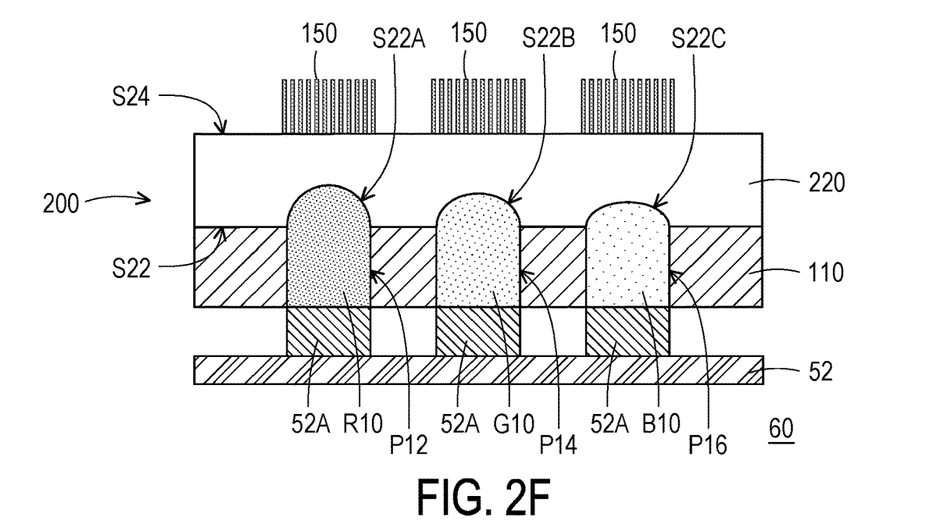

Next, please refer to FIG. 2F, thereafter, the color conversion panel 200 is combined with the light-emitting pixel array panel 52, and the display device 60 of this embodiment is basically completed. Furthermore, the gallium nitride layer 150A is further patterned to form a plurality of metalenses 150 on a surface of the sapphire substrate 220 away from the opaque substrate 110 and corresponding to the first pixel openings P12, the second pixel openings P14, and the third pixel openings P16. The metalens 150 utilizes a combination of microstructures to produce the effect of an optical element. Here, the metalens 150 is configured to produce a light converging effect on the light that passes through, so as to further alleviate cross-talk phenomenon. The metalens 150 is made of gallium nitride.

Since the first pixel opening P12, the second pixel opening P14, and the third pixel opening P16 formed on the opaque substrate 110 are adopted, it is possible to prevent different color lights from generating cross-talk between the first pixel opening P12, the second pixel opening P12, and the third pixel opening P16. Furthermore, the first arc surface S22A, the second arc surface S22B, and the third arc surface S22C also have the effect of converging light, thereby reducing the possibility for the color lights exiting the first arc surface S22A, the second arc surface S22B, and the third arc surface S22C to generate cross-talk. Moreover, since the processing of the sapphire substrate 120 is relatively easy, the process time and cost of the display device 60 and the color conversion panel 200 of this embodiment are also reduced.

In this embodiment, the radian of the first arc surface S22A, the radian of the second arc surface S22B, and the radian of the third arc surface S22C are different from each other. Since the wavelength bands of the color lights passing through the first arc surface S22A, the second arc surface S22B, and the third arc surface S22C are different, the radians may be adjusted for different color lights to obtain the optimal refractive angles respectively, thus alleviating cross-talk phenomenon.

FIG. 3 to FIG. 7 are cross-sectional schematic diagrams of a color conversion panel and a display device according to six other embodiments of the present disclosure.

Figure 3:
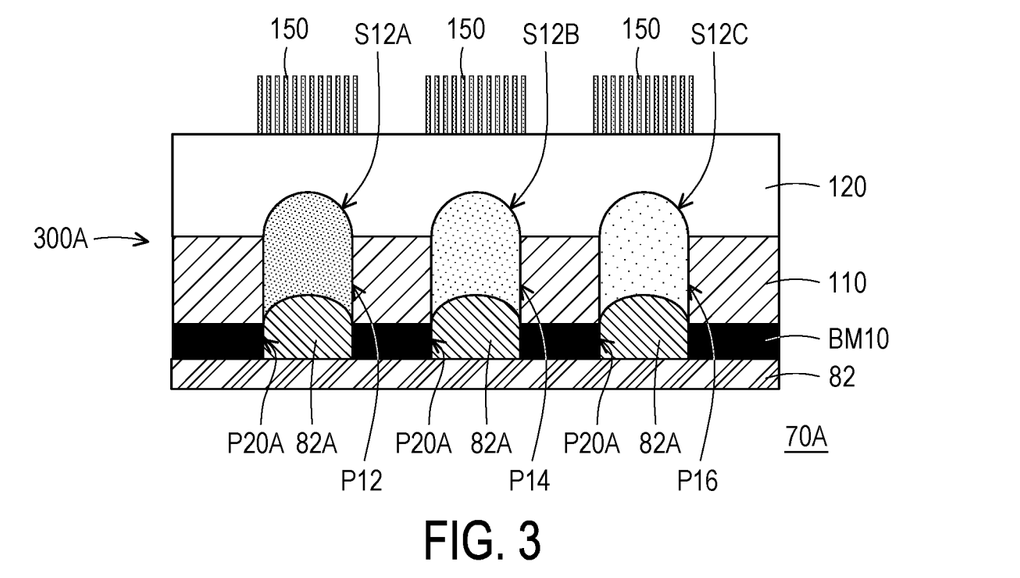
FIG. 3 to FIG. 7 are cross-sectional schematic diagrams of a color conversion panel and a display device according to six other embodiments of the present disclosure.

Referring to FIG. 3, a display device 70A and a color conversion panel 300A of this embodiment are similar to the display device 50 and the color conversion panel 100 of FIG. 1F, and the following description mainly focuses on the differences between the two embodiments. In addition, various additional technical solutions in the foregoing embodiments that do not cause conflict when applied to this embodiment may also be applied to this embodiment. A light-emitting pixel array panel 82 of this embodiment further has a light-blocking matrix BM10, and the light-blocking matrix BM10 has a plurality of light-transmitting openings P20A corresponding to the light-emitting elements 82A. That is, each light-emitting element 82A is located in one light-transmitting opening P20A. Therefore, it is possible to further alleviate the cross-talk phenomenon between adjacent light-emitting elements 82A. Moreover, in this embodiment, one surface of the light-emitting element 82A facing the color conversion panel 300A is an arc surface, so that the light emitted by the light-emitting element 82A is less divergent, and the cross-talk phenomenon between adjacent light-emitting elements 82A may be further alleviated.

Figure 4A:
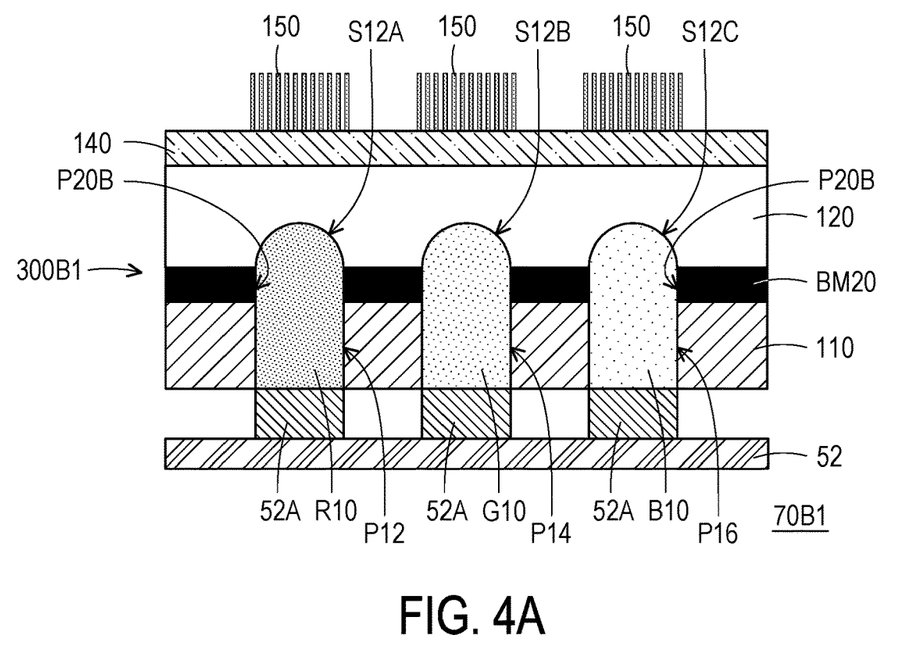

Referring to FIG. 4A, a display device 70B1 and a color conversion panel 300B1 of this embodiment are similar to the display device 50 and the color conversion panel 100 of FIG. 1F, and the following description mainly focuses on the differences between the two embodiments. In addition, various additional technical solutions in the foregoing embodiments that do not cause conflict when applied to this embodiment may also be applied to this embodiment. The color conversion panel 300B1 of this embodiment further includes a light-blocking matrix BM20 disposed between the opaque substrate 110 and the sapphire substrate 120. The light-blocking matrix BM20 has a plurality of light-transmitting openings P20B corresponding to the first pixel openings P12, the second pixel openings P14, and the third pixel openings P16. That is, the red quantum dot material R10 is filled into a space defined by the first pixel opening P12, the light-transmitting opening P20B, and the first arc surface S12A; the green quantum dot material G10 is filled into a space defined by the second pixel opening P14, the light-transmitting opening P20B, and the second arc surface S12B; and the blue quantum dot material B10 is filled into a space defined by the third pixel opening P16, the light-transmitting opening P20B, and the third arc surface S12C. The light-blocking matrix BM20 is able to further alleviate cross-talk phenomenon between the first pixel opening P12, the second pixel opening P14, and the third pixel opening P16. The distributed Bragg reflecting layer 140 is located on the surface of the sapphire substrate 120 away from the opaque substrate 110, and the distributed Bragg reflecting layer 140 is located between the sapphire substrate 120 and the metalens 150.

Figure 4B:
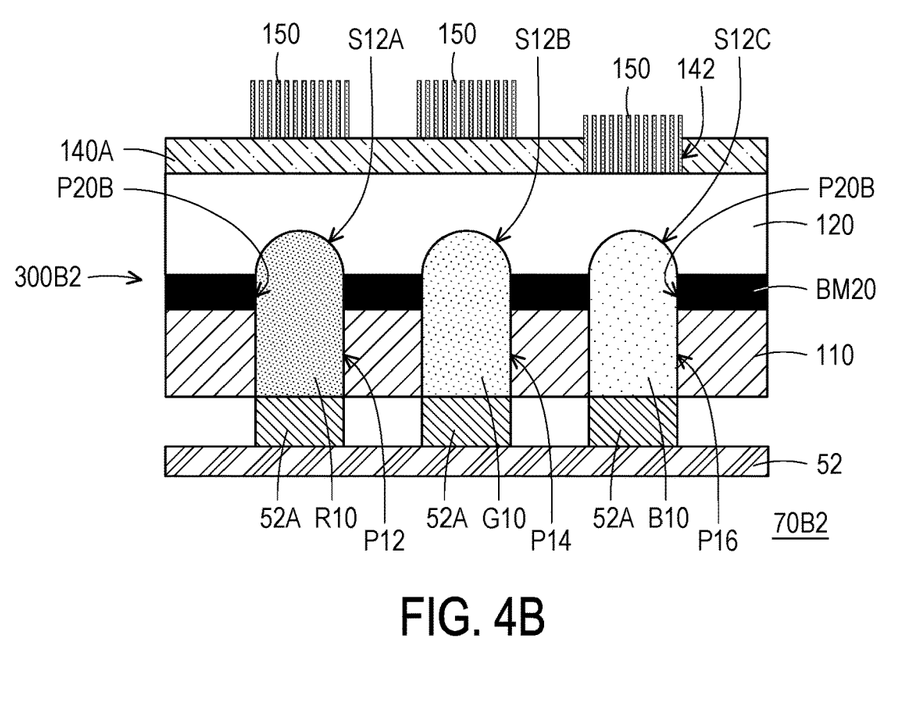

Referring to FIG. 4B, a display device 70B2 and a color conversion panel 300B2 of this embodiment are similar to the display device 70B1 and the color conversion panel 300B1 of FIG. 4A, and the following description mainly focuses on the differences between the two embodiments. In addition, various additional technical solutions in the foregoing embodiments that do not conflict when applied to this embodiment may also be applied to this embodiment. The distributed Bragg reflecting layer 140A of the color conversion panel 300B2 in this embodiment may have an opening 142 corresponding to the third pixel opening P16, so that the blue light passing through the third arc surface S12C may not pass through the distributed Bragg reflecting layer 140A.

In an embodiment that is not shown, the distributed Bragg reflecting layer 140A does not have the opening 142, but a portion of the distributed Bragg reflecting layer 140A corresponding to the third pixel opening P16 may have a thin design, so that the thickness of the distributed Bragg reflecting layer 140A that allows the blue light passing through the third arc surface S12C to pass through is relatively thin. In another embodiment that is not shown, the distributed Bragg reflecting layer 140A may be patterned and only correspond to the first pixel opening P12 and the second pixel opening P14, and positions that do not correspond to the first pixel opening P12 and the second pixel opening P14 are not provided with the distributed Bragg reflecting layer 140A. In another embodiment that is not shown, the distributed Bragg reflecting layer 140A may be patterned, so that the distributed Bragg reflecting layer 140A covers the first pixel opening P12 and the second pixel opening P14, but does not cover the third pixel opening P16.

Figure 5:
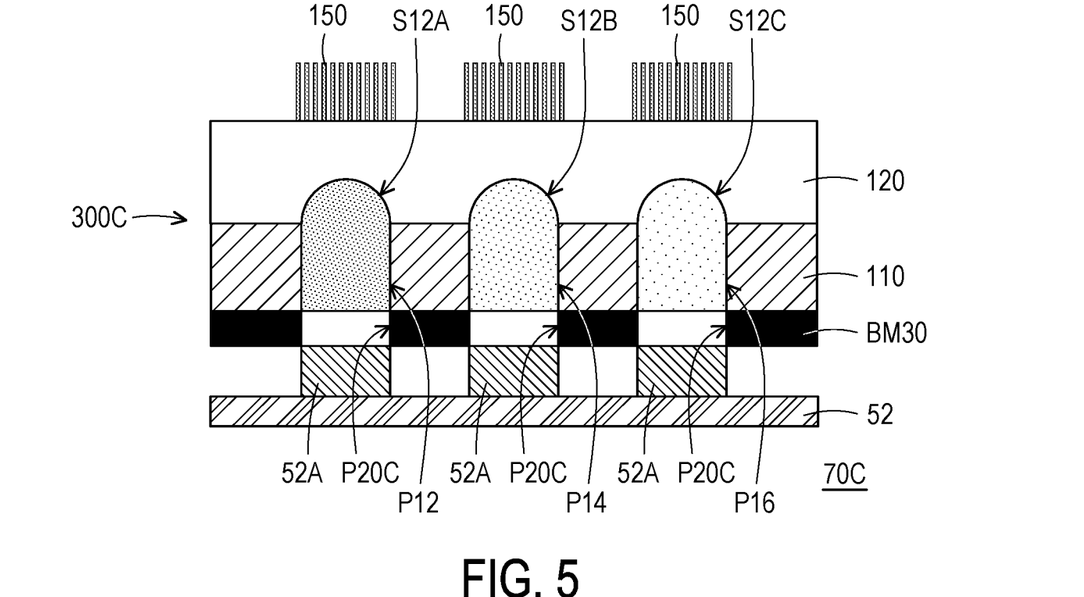

Referring to FIG. 5, a display device 70C and a color conversion panel 300C of this embodiment are similar to the display device 50 and the color conversion panel 100 of FIG. 1F, and the following description mainly focuses on the differences between the two embodiments. In addition, various additional technical solutions in the foregoing embodiments that do not cause conflict when applied to this embodiment may also be applied to this embodiment. The display device 70C of this embodiment further includes a light-blocking matrix BM30 disposed between the light-emitting pixel array panel 52 and the color conversion panel 300C. The light-blocking matrix BM30 has a plurality of light-transmitting openings P20C corresponding to the first pixel opening P12, the second pixel opening P14, and the third pixel opening P16. That is, the light generated by each light-emitting element 52A first passes through the corresponding light-transmitting opening P20C before entering the corresponding first pixel opening P12, the second pixel opening P14, and the third pixel opening P16. The light-blocking matrix BM30 is able to further alleviate the cross-talk phenomenon between adjacent light-emitting elements 52A.

Figure 6:
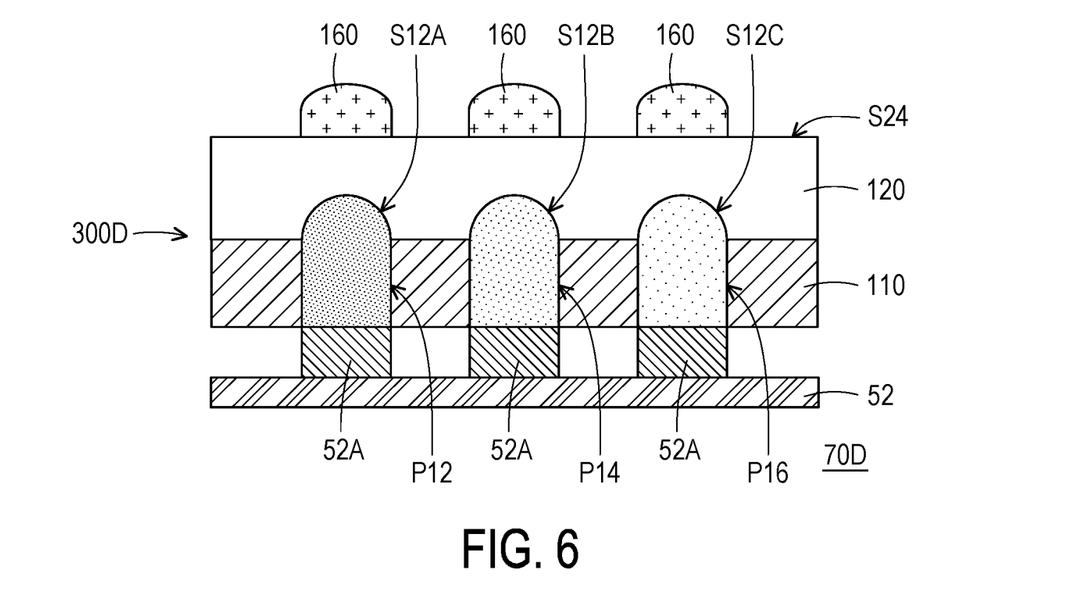

Referring to FIG. 6, a display device 70D and a color conversion panel 300D of this embodiment are similar to the display device 50 and the color conversion panel 100 of FIG. 1F, and the following description mainly focuses on the differences between the two embodiments. In addition, various additional technical solutions in the foregoing embodiments that do not cause conflict when applied to this embodiment may also be applied to this embodiment. The color conversion panel 300D of this embodiment further includes a plurality of micro lenses 160 located on the second surface S24 of the sapphire substrate 120 away from the opaque substrate 110 and corresponding to the first pixel opening P12, the second pixel opening P14, and the third pixel opening P16. The micro lens 160 is configured to converge the light that passes through, so as to further alleviate cross-talk phenomenon. The plurality of micro lenses 160 may be formed by patterning the gallium nitride layer 150A of FIG. 2E. The material of the micro lens 160 is gallium nitride. In other embodiments, there may be a distributed Bragg reflecting layer on a surface of the sapphire substrate 120 away from the opaque substrate 110, and the distributed Bragg reflecting layer 140 is located between the sapphire substrate 120 and the micro lens 160.

Figure 7:
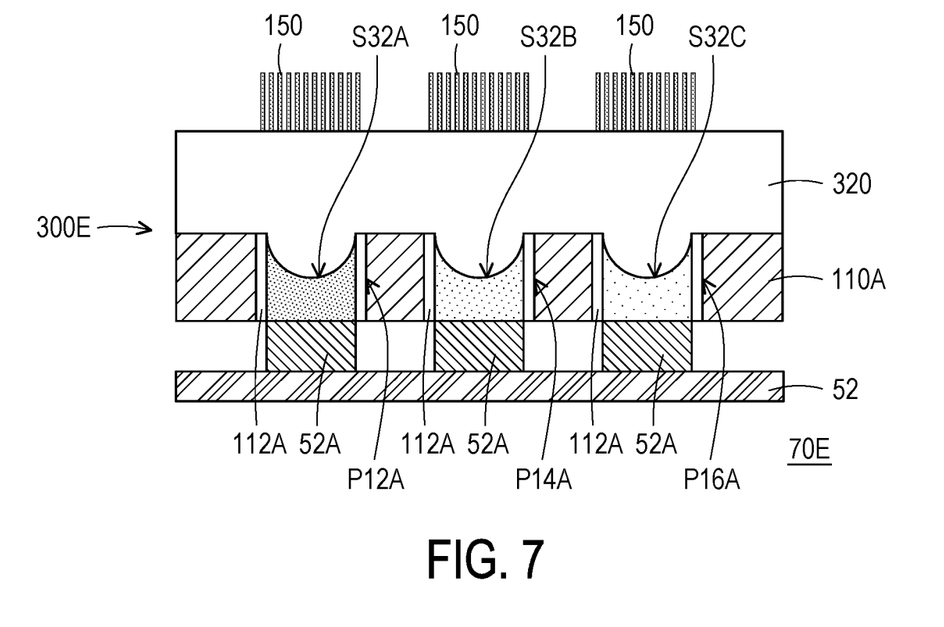

Referring to FIG. 7, a display device 70E and a color conversion panel 300E of this embodiment are similar to the display device 50 and the color conversion panel 100 of FIG. 1F, and the following description mainly focuses on the differences between the two embodiments. In addition, various additional technical solutions in the foregoing embodiments that do not cause conflict when applied to this embodiment may also be applied to this embodiment. In this embodiment, the inner concave surface of the first arc surface S32A, the inner concave surface of the second arc surface S32B, and the inner concave surface of the third arc surface S32C of the sapphire substrate 320 face away from the opaque substrate 110A. In addition, a reflecting layer 112A may be disposed on the inner walls of the first pixel opening P12A, the second pixel opening P14A, and the third pixel opening P16A of the opaque substrate 110A, and the material of the reflecting layer is metal or other highly reflective materials, so as to further reduce light divergence caused by color conversion when light passes through the quantum dot material. In other embodiments, the reflecting layer 112 may also be disposed only on the inner walls of the first pixel opening P12A and the second pixel opening P14A.

To sum up, in the color conversion panel and the display device of the present disclosure, the pixel openings of the opaque substrate are able to avoid cross-talk phenomenon, and the arc surfaces of the sapphire substrate are able to produce light-converging effect, thereby improving the display quality.

What is claimed is:

1. A color conversion panel, comprising:
an opaque substrate, which comprises a plurality of first pixel openings, a plurality of second pixel openings, and a plurality of third pixel openings, wherein the first pixel openings are filled with a red quantum dot material, and the second pixel openings are filled with a green quantum dot material; and
a sapphire substrate, which is disposed on the opaque substrate, wherein a first surface of the sapphire substrate that faces the opaque substrate has a plurality of first arc surfaces corresponding to the first pixel openings, a plurality of second arc surfaces corresponding to the second pixel openings, and a plurality of third arc surfaces corresponding to the third pixel openings.

2. The color conversion panel according to claim 1, further comprising a plurality of metalenses located on a second surface of the sapphire substrate away from the opaque substrate and corresponding to the first pixel openings, the second pixel openings and the third pixel openings.

3. The color conversion panel according to claim 1, further comprising a plurality of micro lenses located on a second surface of the sapphire substrate away from the opaque substrate and corresponding to the first pixel openings, the second pixel openings and the third pixel openings.

4. The color conversion panel according to claim 1, further comprising a distributed Bragg reflecting layer disposed on a second surface of the sapphire substrate away from the opaque substrate.

5. The color conversion panel according to claim 1, wherein radians of the first arc surfaces are different from radians of the second arc surfaces.

6. The color conversion panel according to claim 1, further comprising a plurality of high-refractive material layers located between the first arc surfaces and the first pixel openings, between the second arc surfaces and the second pixel openings, and between the third arc surfaces and the third pixel openings, and refractive indices of the high-refractive material layers are between 1.7 and 2.0.

7. The color conversion panel according to claim 1, wherein inner concave surfaces of the first arc surfaces, inner concave surfaces of the second arc surfaces, and inner concave surfaces of the third arc surfaces face the opaque substrate.

8. The color conversion panel according to claim 1, wherein inner concave surfaces of the first arc surfaces, inner concave surfaces of the second arc surfaces, and inner concave surfaces of the third arc surfaces face away from the opaque substrate.

9. The color conversion panel according to claim 1, further comprising a light-blocking matrix disposed between the opaque substrate and the sapphire substrate, wherein the light-blocking matrix has a plurality of light-transmitting openings corresponding to the first pixel openings, the second pixel openings and the third pixel openings.

10. A display device, comprising:
a light-emitting pixel array panel, which has a plurality of light-emitting elements;
a color conversion panel, which is disposed on the light-emitting pixel array panel, and comprises:
an opaque substrate, which comprises a plurality of first pixel openings, a plurality of second pixel openings and a plurality of third pixel openings, wherein the first pixel openings are filled with a red quantum dot material, the second pixel openings are filled with a green quantum dot material; and
a sapphire substrate, which is disposed on the opaque substrate, wherein a first surface of the sapphire substrate that faces the opaque substrate has a plurality of first arc surfaces corresponding to the first pixel openings, a plurality of second arc surfaces corresponding to the second pixel openings, and a plurality of third arc surfaces corresponding to the third pixel openings.

11. The display device according to claim 10, wherein the color conversion panel further comprises a plurality of metalenses located on a second surface of the sapphire substrate away from the opaque substrate and corresponding to the first pixel openings, the second pixel openings and the third pixel openings.

12. The display device according to claim 10, wherein the color conversion panel further comprises a plurality of micro lenses located on a second surface of the sapphire substrate away from the opaque substrate and corresponding to the first pixel openings, the second pixel openings and the third pixel openings.

13. The display device according to claim 10, wherein the color conversion panel further comprises a distributed Bragg reflecting layer disposed on a second surface of the sapphire substrate away from the opaque substrate.

14. The display device according to claim 10, wherein the color conversion panel further comprises a plurality of high-refractive material layers located between the first arc surfaces and the first pixel openings, between the second arc surfaces and the second pixel openings, and between the third arc surfaces and the third pixel openings, and refractive indices of the high-refractive material layers are between 1.7 and 2.0.

15. The display device according to claim 10, wherein inner concave surfaces of the first arc surfaces, inner concave surfaces of the second arc surfaces, and inner concave surfaces of the third arc surfaces face the opaque substrate.

16. The display device according to claim 10, wherein inner concave surfaces of the first arc surfaces, inner concave surfaces of the second arc surfaces, and inner concave surfaces of the third arc surfaces face away from the opaque substrate.

17. The display device according to claim 10, wherein the color conversion panel further comprises a light-blocking matrix disposed between the opaque substrate and the sapphire substrate, wherein the light-blocking matrix has a plurality of light-transmitting openings corresponding to the first pixel openings, the second pixel openings and the third pixel openings.

18. The display device according to claim 10, further comprising a light-blocking matrix disposed between the light-emitting pixel array panel and the color conversion panel, wherein the light-blocking matrix has a plurality of light-transmitting openings corresponding to the first pixel openings, the second pixel openings and the third pixel openings.

19. The display device according to claim 10, wherein the light-emitting pixel array panel further has a light-blocking matrix, and the light-blocking matrix has a plurality of light-transmitting openings corresponding to the light-emitting elements, and the light-emitting elements are located in the light-transmitting openings.

20. The display device according to claim 10, wherein a surface of the light-emitting elements facing the color conversion panel is an arc surface.

* * * * *